(12) United States Patent
Rha et al.

(10) Patent No.: US 11,576,270 B2
(45) Date of Patent: Feb. 7, 2023

(54) DISPLAY APPARATUS

(71) Applicant: SAMSUNG ELECTRONICS CO., LTD., Suwon-si (KR)

(72) Inventors: Beomkyun Rha, Suwon-si (KR); Kibum Seong, Suwon-si (KR); Woosung Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/135,409

(22) Filed: Dec. 28, 2020

(65) Prior Publication Data

US 2021/0204426 A1  Jul. 1, 2021

Related U.S. Application Data

(60) Provisional application No. 62/954,788, filed on Dec. 30, 2019.

(30) Foreign Application Priority Data

Apr. 1, 2020  (KR) ........................ 10-2020-0039937

(51) Int. Cl.
  *H05K 5/02*  (2006.01)
  *H05K 5/00*  (2006.01)
  *G06F 1/16*  (2006.01)

(52) U.S. Cl.
  CPC ......... *H05K 5/0217* (2013.01); *G06F 1/1652* (2013.01); *H05K 5/0017* (2013.01)

(58) Field of Classification Search
  CPC ... H05K 5/0217; H05K 5/0017; G06F 1/1652
  See application file for complete search history.

(56) References Cited

U.S. PATENT DOCUMENTS

| 9,558,685 | B2 | 1/2017 | Lee et al. |
| 9,685,100 | B2 | 6/2017 | Choi et al. |
| 9,756,757 | B2 * | 9/2017 | Park ................ H05K 5/0017 |
| 9,860,474 | B2 | 1/2018 | Park et al. |
| 9,864,412 | B2 * | 1/2018 | Park ................ G06F 1/1652 |

(Continued)

FOREIGN PATENT DOCUMENTS

| JP | 4779046 B2 | 9/2011 |
| JP | 2016-110114 A | 6/2016 |

(Continued)

OTHER PUBLICATIONS

Communication dated Mar. 12, 2021, issued by the International Searching Authority in counterpart International Application No. PCT/KR2020/017658 (PCT/ISA/210 and 237).

(Continued)

*Primary Examiner* — Hung S. Bui
*Assistant Examiner* — Sagar Shrestha
(74) *Attorney, Agent, or Firm* — Sughrue Mion, PLLC

(57) ABSTRACT

A display apparatus includes a housing provided with an opening at a front surface, a roll disposed within the housing, and a display wound to the roll and capable of extending and retracting through the opening. The opening is disposed to be adjacent to a first edge of the front surface, and the display is configured to move in parallel with the front surface toward a second edge of the front surface facing the first edge from a front of the housing.

13 Claims, 10 Drawing Sheets

(56) References Cited

U.S. PATENT DOCUMENTS

| | | | |
|---|---|---|---|
| 10,013,955 B2 | 7/2018 | Oh et al. | |
| 10,128,458 B2 * | 11/2018 | Lee | G09F 9/301 |
| 10,186,681 B2 * | 1/2019 | Kang | H01L 27/32 |
| 10,216,398 B2 | 2/2019 | Woo et al. | |
| 10,223,942 B2 | 3/2019 | Chu | |
| 10,304,417 B2 | 5/2019 | Park et al. | |
| 10,420,227 B2 | 9/2019 | Lee et al. | |
| 10,534,402 B1 * | 1/2020 | Kim | G09F 15/0062 |
| 10,535,836 B2 | 1/2020 | Kim et al. | |
| 10,537,026 B2 | 1/2020 | Shin et al. | |
| 10,582,622 B2 | 3/2020 | Kim et al. | |
| 10,617,017 B2 | 4/2020 | Park et al. | |
| 10,701,821 B2 | 6/2020 | Kim et al. | |
| 10,765,021 B2 | 9/2020 | Shin et al. | |
| 10,789,863 B2 * | 9/2020 | Song | H05K 1/189 |
| 10,888,005 B2 | 1/2021 | Lee et al. | |
| RE48,782 E | 10/2021 | Park et al. | |
| 2008/0049003 A1 | 2/2008 | Hasegawa | |
| 2012/0002357 A1 * | 1/2012 | Auld | G09F 11/30 |
| | | | 361/679.01 |
| 2012/0306910 A1 | 12/2012 | Kim et al. | |
| 2016/0112667 A1 * | 4/2016 | Park | H04N 21/42201 |
| | | | 348/739 |
| 2016/0135284 A1 | 5/2016 | Choi et al. | |
| 2016/0307545 A1 * | 10/2016 | Lee | G09G 3/2003 |
| 2016/0363960 A1 * | 12/2016 | Park | G09F 9/301 |
| 2016/0374228 A1 * | 12/2016 | Park | H05K 7/16 |
| 2017/0023978 A1 * | 1/2017 | Cho | G06F 1/1652 |
| 2017/0140504 A1 | 5/2017 | Jeong et al. | |
| 2017/0156219 A1 * | 6/2017 | Heo | H01L 51/0097 |
| 2017/0161868 A1 * | 6/2017 | Kim | H05K 5/0017 |
| 2017/0196102 A1 * | 7/2017 | Shin | H05K 1/111 |
| 2017/0318693 A1 | 11/2017 | Kim et al. | |
| 2017/0325342 A1 * | 11/2017 | Lee | G06F 1/1652 |
| 2017/0325343 A1 * | 11/2017 | Seo | H01L 51/0097 |
| 2018/0014415 A1 * | 1/2018 | Choi | H05K 5/0217 |
| 2018/0070466 A1 * | 3/2018 | Kim | H05K 5/0217 |
| 2018/0070467 A1 * | 3/2018 | Kim | H01L 51/0097 |
| 2018/0376603 A1 | 12/2018 | Lee et al. | |
| 2019/0037710 A1 * | 1/2019 | Han | G09F 9/30 |
| 2019/0112869 A1 | 4/2019 | Chi et al. | |
| 2019/0138058 A1 * | 5/2019 | Kwon | G06F 1/1652 |
| 2019/0174644 A1 | 6/2019 | Kim et al. | |
| 2019/0212780 A1 * | 7/2019 | Choi | G09G 3/3266 |
| 2019/0324501 A1 * | 10/2019 | Kim | H05K 5/0017 |
| 2019/0364676 A1 | 11/2019 | Lee et al. | |
| 2020/0077194 A1 * | 3/2020 | Kim | H04R 9/045 |
| 2020/0103476 A1 | 4/2020 | Shin et al. | |
| 2020/0221585 A1 * | 7/2020 | Cho | H05K 5/0217 |
| 2020/0365063 A1 * | 11/2020 | Park | G06F 1/1601 |
| 2021/0084779 A1 | 3/2021 | Lee et al. | |
| 2021/0201713 A1 * | 7/2021 | Chung | G09F 9/301 |

FOREIGN PATENT DOCUMENTS

| | | |
|---|---|---|
| JP | 6251799 B1 | 12/2017 |
| KR | 10-1395783 B1 | 5/2014 |
| KR | 10-2016-0057046 A | 5/2016 |
| KR | 10-2016-0123620 A | 10/2016 |
| KR | 10-2017-0008610 A | 1/2017 |
| KR | 10-2017-0012628 A | 2/2017 |
| KR | 10-2017-0014886 A | 2/2017 |
| KR | 10-2017-0043347 A | 4/2017 |
| KR | 10-2017-0081347 A | 7/2017 |
| KR | 10-2018-0134236 A | 12/2018 |
| KR | 10-2018-0135704 A | 12/2018 |
| KR | 10-2019-0013001 A | 2/2019 |
| KR | 10-2019-0013003 A | 2/2019 |
| KR | 10-2023015 B1 | 9/2019 |
| KR | 10-2091602 B1 | 3/2020 |
| KR | 10-2333180 B1 | 11/2021 |

OTHER PUBLICATIONS

Search Report dated Aug. 19, 2022 by the European Patent Office in corresponding European Patent Application No. 20909595.9.

\* cited by examiner

DISPLAY APPARATUS

CROSS-REFERENCE TO RELATED APPLICATIONS

This application is based on and claims priority under 35 U.S.C. § 119 to Korean Patent Application No. 10-2020-0039937, filed on Apr. 1, 2020, in the Korean Intellectual Property Office, which claims the benefit of U.S. Provisional Patent Application No. 62/954,788, filed on Dec. 30, 2019, in the U.S. Patent and Trademark Office, the disclosures of which are incorporated by reference herein in their entireties.

BACKGROUND

1. Field

The disclosure relates to a display apparatus. More particularly, the disclosure relates to a display apparatus capable of enhancing a sense of immersion of users caused by an extendable rollable display covering a front-surface of a housing.

2. Description of Related Art

Recently, while electronic apparatuses provided with a display apparatus are being miniaturized, there are many consumers demanding large scale screens.

Accordingly, recent display apparatuses have been configured so that a rollable display is extended through an opening provided at a top-surface or a bottom-surface of a housing only when a user uses a display apparatus.

However, even if the rollable display is extended from the housing, there is the problem of a front-surface of the housing still being exposed and reducing the sense of immersion of the user.

SUMMARY

In accordance with an aspect of the disclosure, a display apparatus includes a housing provided with an opening at a front surface; a roll disposed within the housing; and a display wound to the roll and capable of extending and retracting through the opening, wherein the opening is disposed to be adjacent to a first edge of the front surface, and wherein the display is configured to move in parallel with the front surface toward a second edge of the front surface facing the first edge from a front of the housing.

A maximum extension length of the display may be twice a horizontal length of the display, the horizontal length of the display extending in a direction perpendicular to a direction of extension of the display.

The display apparatus may further include a driving device including a motor configured to rotate the roll; and a processor configured to control the driving device to extend the display corresponding to an output aspect ratio of an image displayed on the display.

The display apparatus may further include a driving device including a motor configured to rotate the roll; a sensor configured to detect an eye level of a user; and a processor configured to control the driving device to extend the display to a position corresponding to the eye level of the user detected by the sensor.

A portion of the display from among an extended section of the display may not output an image.

The display may be configured to be extended from a top side, a bottom side, a left side, or a right side of the housing.

The display may include a flexible material from one end of the display connected to the roll to a point of the display adjacent to the opening.

The display apparatus may further include an auxiliary roll configured to guide a movement direction of the display, wherein at least a portion of the auxiliary roll protrudes from the front surface of the housing through the opening.

The display apparatus may further include an auxiliary driving device including an auxiliary motor configured to move the auxiliary roll; and a processor configured to cause the at least a portion of the auxiliary roll to protrude from the front surface of the housing, and control the auxiliary driving device to cause the auxiliary roll to be accommodated within the housing.

The housing may include a groove in which a shaft of the auxiliary roll is inserted and supported in an inner surface of the housing, and the shaft of the auxiliary roll may be movable along the groove.

The display apparatus may further include an auxiliary roll disposed within the housing, wherein the front surface of the housing includes a first front surface area and a second front surface area that protrudes more toward a front of the housing than the first front surface area, wherein the opening is formed between the first front surface area and the second front surface area, and wherein the auxiliary roll is configured to guide a moving direction of the display, wherein at least a portion of the auxiliary roll protrudes from the first front surface area of the housing.

The display apparatus may further include a connecting member configured to selectively connect with the display, the connecting member being movable on the front surface of the housing; and a motor configured to move the connecting member in parallel with the front surface of the housing.

The display apparatus may further include a supporting member including a multilevel structure, the supporting member being capable of expanding and contracting in parallel with a moving direction of the display, wherein the display is supported by the supporting member.

BRIEF DESCRIPTION OF THE DRAWINGS

The above and other aspects, features and advantages of certain embodiments of the present disclosure will be more apparent from the following description taken in conjunction with the accompanying drawings, in which.

DETAILED DESCRIPTION

Figure 1:
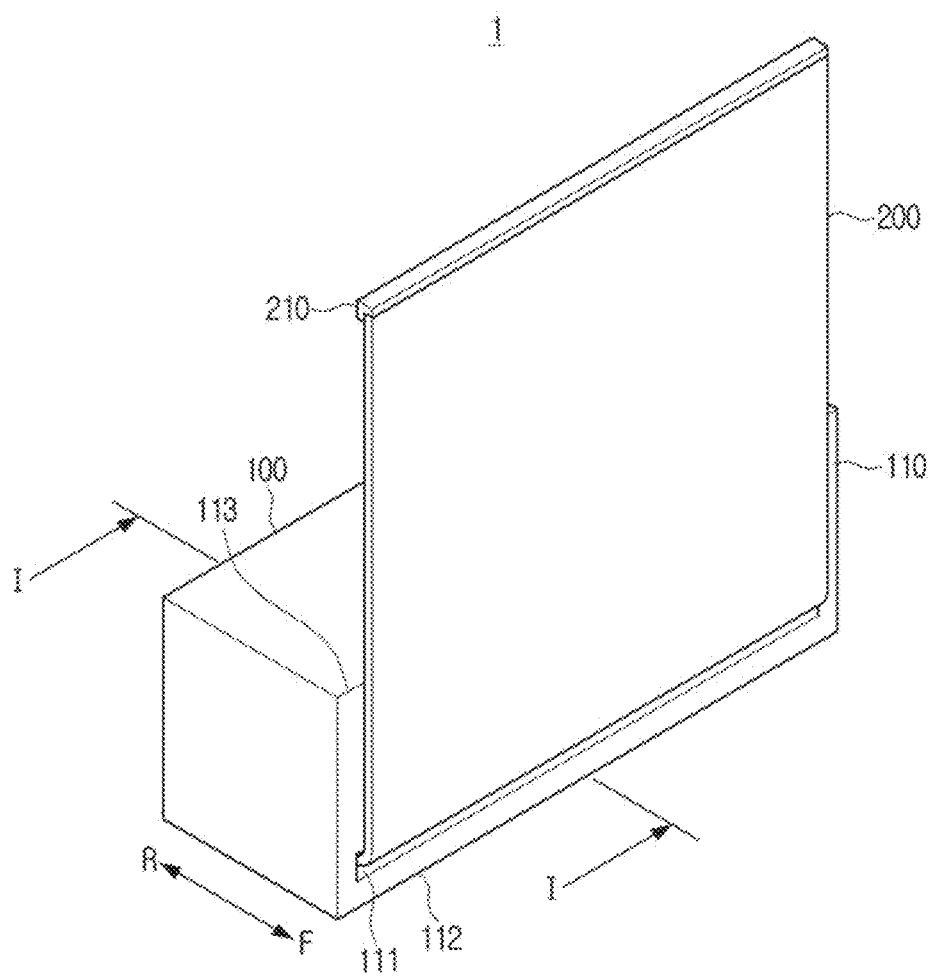
FIG. 1 is a perspective view illustrating schematically a display apparatus according to an embodiment.

Embodiments described in the disclosure are provided as example embodiments to assist in the understanding of the disclosure, and various modifications may be made and practiced. However, in describing the disclosure, in case it is determined that the detailed description of related known technologies may unnecessarily confuse the gist of the disclosure, the detailed description and detailed drawing will be omitted. In addition, it should be noted that the accompanying drawings may not be illustrated to an actual scale but dimensions of some elements may be exaggeratedly illustrated to assist in the understanding of the disclosure.

The terms used in the disclosure and the claims are general terms identified in consideration of the functions of the various embodiments of the disclosure. However, these terms may vary depending on intention, legal or technical interpretation, emergence of new technologies, and the like of those skilled in the related art. Also, there may be some terms arbitrarily identified by an applicant. Unless there is a specific definition of a term, the term may be construed based on the overall contents and technological common sense of those skilled in the related art.

It is to be understood that expressions such as "comprise," "may comprise," "include," or "may include" are used herein to designate a presence of a corresponding characteristic (e.g., element such as a number, a step, an operation, a component, or the like), and not to preclude a presence or a possibility of additional characteristics.

The terms such as "first," "second," and so on may be used to describe a variety of elements, but the elements should not be limited by these terms. The terms are used only for the purpose of distinguishing one element from another. For example, without exceeding the scope of protection, a first element may be designated as a second element and likewise, a second element may also be designated as a first element.

In addition, terms such as 'front surface,' 'rear surface,' 'top surface,' 'bottom surface,' 'side surface,' 'left surface,' 'right surface,' 'upper part,' 'lower part,' or the like have been defined based on the drawings, and the shape and position of each element may not be limited by these terms.

Further, because the disclosure describes elements necessary in the description of each embodiment, the embodiments are not necessarily limited thereto. Accordingly, some elements may be modified or omitted, and other elements may be included. In addition, the elements may be dispersed and disposed in devices which are independent from one another.

Further, although the embodiments of the disclosure have been described with reference to the accompanying drawings and the descriptions disclosed in the accompanying drawings, the disclosure is not limited to the specific embodiments described herein.

The disclosure provides a display apparatus capable of enhancing a sense of immersion of a user caused by an extracted rollable display covering a front-surface of a housing.

Figure 2:
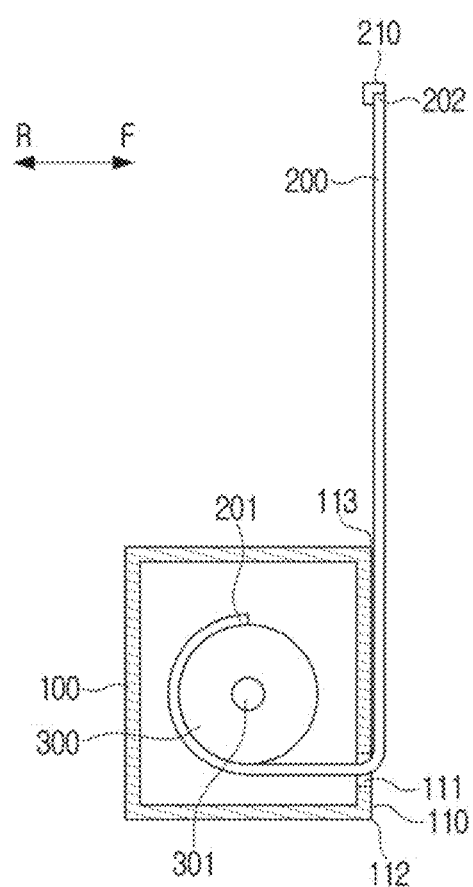
FIG. 2 is a cross-sectional view taken along line I-I of the display apparatus illustrated in FIG. 1.
Figure 3:
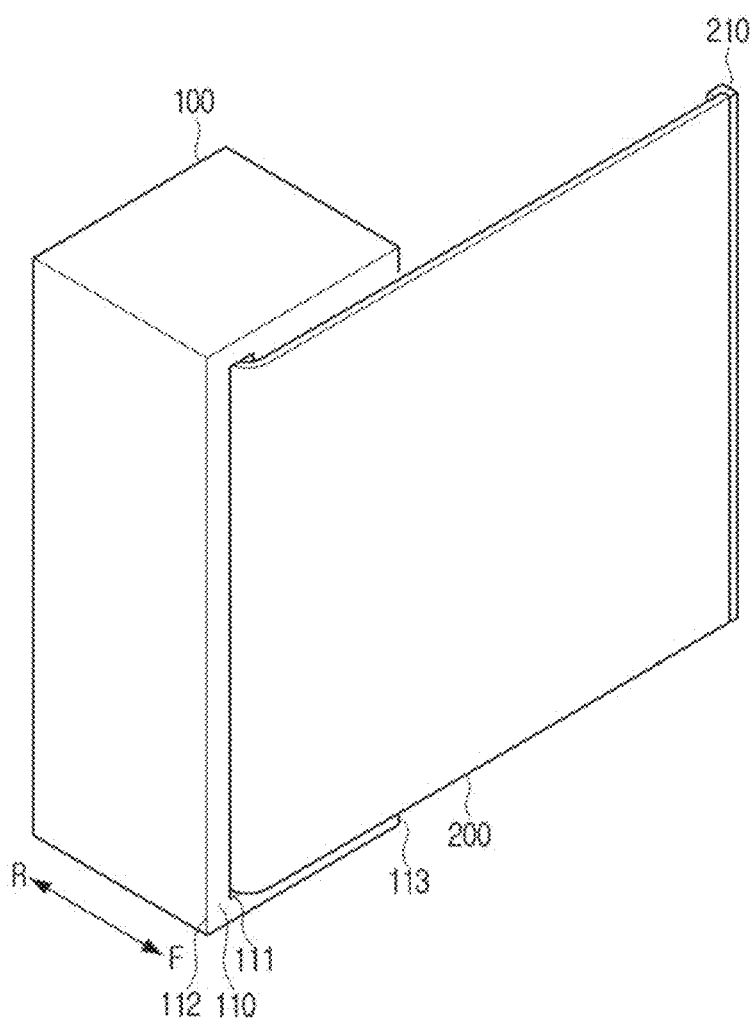
FIG. 3 is a perspective view illustrating a display apparatus in which a display is extracted to a right-side direction of a housing according to an embodiment.

FIG. 1 is a perspective view illustrating schematically a display apparatus according to an embodiment of the disclosure. FIG. 2 is a cross-sectional view taken along line I-I of the display apparatus illustrated in FIG. 1. FIG. 3 is a perspective view illustrating a display apparatus in which a display is extracted to a right-side direction of a housing.

Referring to FIGS. 1 to 2, the display apparatus 1 may include a housing 100, a display 200 and a roll 300, and may be configured to store the display inside of the housing 100 by rolling display 200 on the roll 300, and include a structure providing the user with a variety of images by extracting the display to an outside of the housing 100 if necessary.

The display apparatus 1 according to various embodiments of the disclosure may be an electronic device comprising an image display function, a piece of furniture, or a part of a building or structure. For example, the display apparatus 1 may include at least one from among a television, a digital video disk (DVD) player, a smartphone, a desktop personal computer (PC), a tablet PC, a laptop PC, a personal digital assistant (PDA), a portable multimedia player (PMP), a mobile medical device, a camera, a wearable device, a TV box (e.g., a SAMSUMG HomeSync™, an APPLE TV™, or a GOOGLE TV™), a game console, an electronic board, an electronic signature receiving device, a projector, or various measurement devices (e.g., water meter, electric meter, gas meter, wave meter, etc.).

The housing 100 may form an exterior of the display apparatus 1, and may be comprised of a metal or plastic material. In addition, the housing 100 may roughly have a rectangular parallelepiped shape, but is not limited thereto, and the material, size, and shape of the housing 100 may be variously formed.

The housing 100 may accommodate a display 200 inside thereof, and may include an opening 111 at the front surface 110 for the display 200 to be extracted outside of the housing 100. That is, the display 200 may be extracted and retracted through the opening 111 of the housing 100 if necessary.

Based on the opening 111 being formed at the front surface 110 of the housing 100, the display 200 which is extracted through the opening 111 may cover at least a portion of the front surface 110 of the housing 100. Accordingly, based on the display 200 being extracted outside of the housing 100, because at least a portion of the housing 100 is covered by the extracted display 200, the user may view the image output by the display 200 immersively.

Particularly, the opening 111 may be disposed to be adjacent to a first edge 112 of the front surface 110 of the housing 100, and the display 200 may be moved toward a second edge 113 of the front surface 110 of the housing 100 facing the first edge 112 as shown in FIGS. 1-3. Accordingly, because the extracted display 200 may cover most of the front surface 110 of the housing 100, the user may view the image output by the display 200 more immersively.

The first and second edges 112 and 113 have been illustrated in FIG. 1 as corresponding to bottom side and top side of the front surface 110, respectively, but is not limited thereto, and the first edge 112 may correspond to any one from among the top side edge, the bottom side edge, the left side edge or the right side edge of the front surface 110.

The display 200 may display various content (e.g., texts, images, videos, icons, symbols, etc.) to the user. The display 200 may include, for example, and without limitation, a liquid crystal display (LCD), a light-emitting diode (LED) display, an organic light-emitting diode (OLED) display, a microelectromechanical systems (MEMS) display, an electronic paper display, or a flexible display where the display part may be bent or curved.

The display 200 may be configured for one end 201 and another end 202 to be connected to a roll 300 and a top frame 210, respectively, and the surface to which image is output may be rolled to face outward on the roll 300. The top frame 210 may be coupled to the other end 202 of the display 200, and supported by a moving device 800 (see, e.g., FIG. 9) and a link member 900 (see, e.g., FIG. 9), which will be described below, for the display to be stably retracted and extended.

In addition, the display 200 may be formed of a flexible material from the one end 201 connected to the roll 300 to a point adjacent with the opening 111. The above-described flexible material may be formed of a lycra material, a creora material, a knit material, a silicon material, a rubber material, or a flexible urethane material, but is not limited thereto.

Accordingly, the display may be flexibly curved within the housing 100 from the one end 201 to a point adjacent with the opening 111. That is, the display may be configured such that one section is formed with a flexible material to be smoothly rolled on the roll 300, and may be smoothly retracted and extended through the opening 111. In addition, the extended section of the display may be stably supported by the section formed with the flexible material.

The roll 300 may be disposed within the housing 100 and may roll the display 200. In addition, a rotation axis 301 of the roll 300 may be supported to be rotatable in the housing 100, and may cause the display to be retracted and extended based on rotating in a forward direction or a reverse direction.

Specifically, based on the rotation axis 301 of the roll 300 rotating in one direction, the display 200 may rolled on the roll 300 and retracted within the housing 100, and based on the rotation axis 301 of the roll 300 rotating to an opposite direction, the rolled display 200 on the roll 300 may be unrolled and extended outside of the housing 100.

Referring to FIG. 3, the display 200 may not only be extended to a top side of the housing 100, but also it may be extended to a right side of the housing 100. However, the extension direction of the display 200 is not limited thereto, and the display 200 may also be extended to a left side or a bottom side of the housing 100.

Accordingly, the user may flexibly select the extension direction of the display 200, an arrangement position of the display apparatus 1, or the like, according to a viewing environment.

Figure 4:
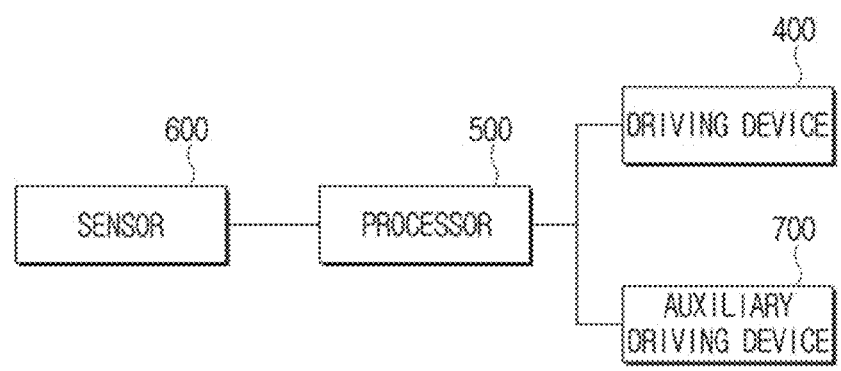
FIG. 4 is a block diagram illustrating schematically a control process of a display apparatus according to an embodiment.

FIG. 4 is a block diagram illustrating schematically a control process of a display apparatus according to an embodiment of the disclosure.

Referring to FIG. 4, a driving device 400 may rotate the roll 300 to retract or extend the display 200 from the housing 100. Specifically, the driving device 400 may be implemented as a direct current (DC) motor, a brushless motor, a step motor, or a servo motor, and may rotate the rotation axis 301 of the roll 300 to which the display 200 is rolled.

The driving device 400 may not only directly rotate the roll 300, but also directly move the display 200. Accordingly, the roll 300 may be passively rotated by a frictional force with the display 200, and the display 200 may be rolled on or unrolled from the roll 300.

The processor 500 may control the overall operation of the display apparatus 1. Specifically, the processor 500 may be implemented as an integrated circuit (IC), a system on chip (SoC), or a mobile application processor (AP), and may transmit data (e.g., image data, moving image data, or still image data) to be displayed to the display 200.

In addition, the processor 500 may be configured to control the driving device 400 to identify a rotation direction and a rotation amount of the roll 300. Accordingly, the processor 500 may be configured to identify whether or not the display is extended or retracted and the extension amount and retraction amount thereof.

Figure 5:
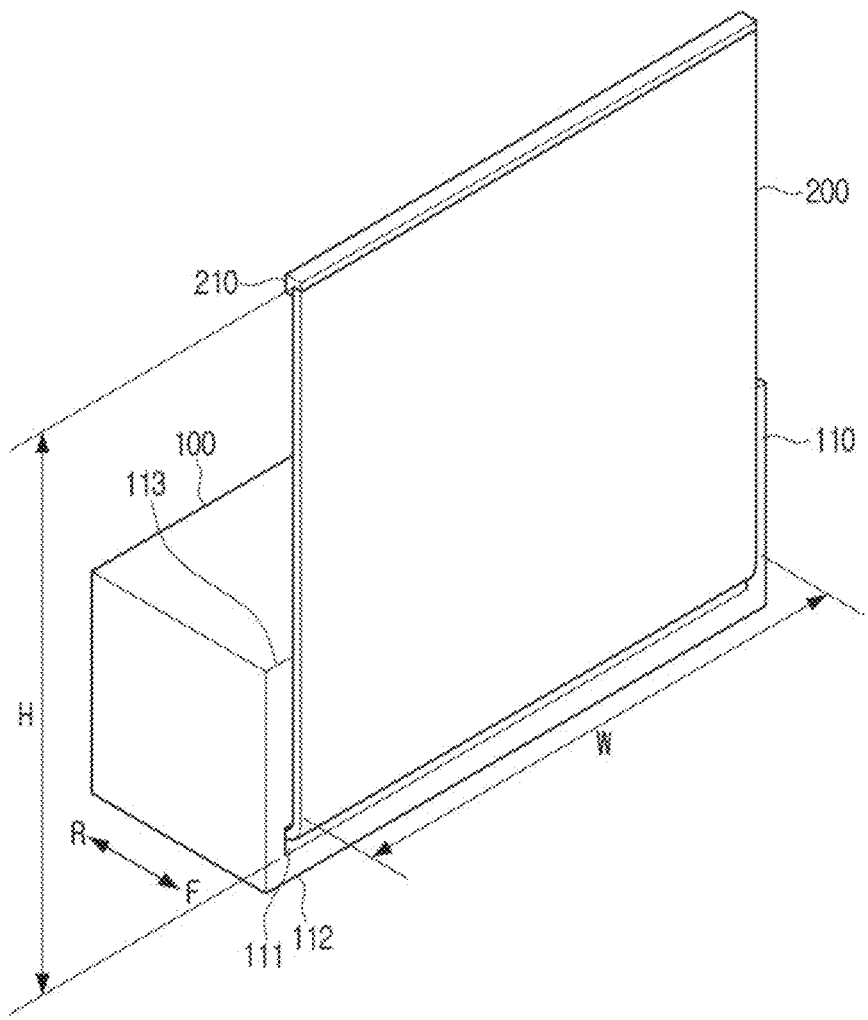
FIG. 5 is a perspective view illustrating a display apparatus in which a display is extracted corresponding to a screen ratio output by the display according to an embodiment.

The sensor 600 may be configured to detect user information (e.g., height, eye level, etc. of the user) located at the front F of the display apparatus 1 as shown in FIG. 5, and transmit the detected data to the processor 500. For example, the sensor 600 may be an imaging device, and may detect the user from a captured image and transmit the location of the detected user to the processor 500.

The processor 500 may be configured to, in response to the data received from the sensor 600, control the driving device 400 to rotate the roll 300. The process of the processor controlling the driving device 400 by using the detected data of the sensor 600 will be described in detail below with reference to FIG. 6.

Figure 7:
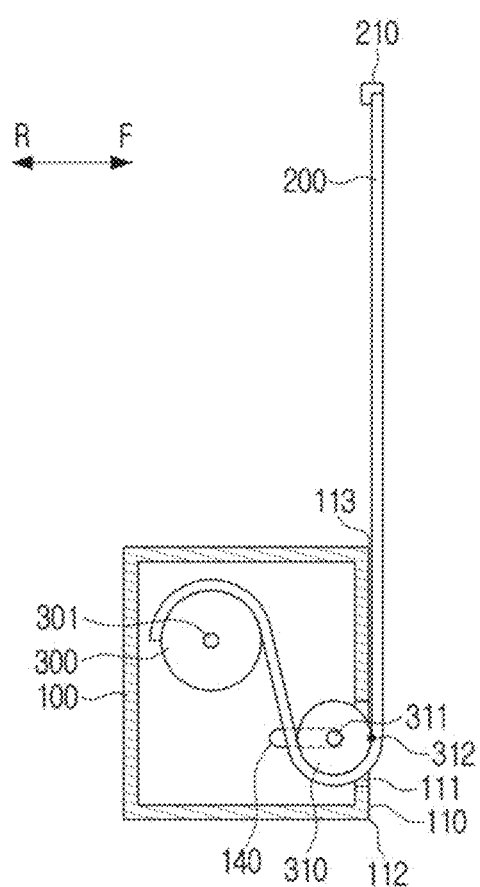
FIG. 7 is a cross-sectional view illustrating a display apparatus comprising an auxiliary roll according to an embodiment.

The auxiliary driving device 700 may move an auxiliary roll 310 (see, e.g., FIG. 7). The process of the processor 500 controlling the auxiliary driving device 700 will be described in detail below with reference to FIG. 7.

The control process of the display apparatus 1 according to the various embodiments of the disclosure will be described in detail below with reference to FIGS. 5 to 6.

FIG. 5 is a perspective view illustrating a display apparatus in which a display is extended corresponding to a screen ratio output by the display. FIG. 6 is a perspective view illustrating a display apparatus in which a display is extended corresponding to an eye level of a user.

Referring to FIG. 5, the display 200 may be configured to be extended corresponding to an aspect ratio of an output content. The display 200 may be configured to be extended to cause the ratio (W:H) of the horizontal length W and the extension length H to be the same as the aspect ratio of the content being output.

The processor 500 may be configured to detect the aspect ratio of the content to be output, and control the driving device 400 to cause the display 200 to be extended in the same aspect ratio. Accordingly, because a content with a specific aspect ratio may be output to fully fill in the extracted display 200, the user may immersively view the content output by the display 200 in full screen.

In addition, the display 200 may be configured so that the maximum extension length H is twofold or more of the horizontal length W. Accordingly, the display 200 may be extended corresponding to the aspect ratio of not only horizontal content but also vertical content (e.g., aspect ratio may be 4:3, 9:18, etc.). That is, the user may view content of various aspect ratios in full screen.

Figure 6:
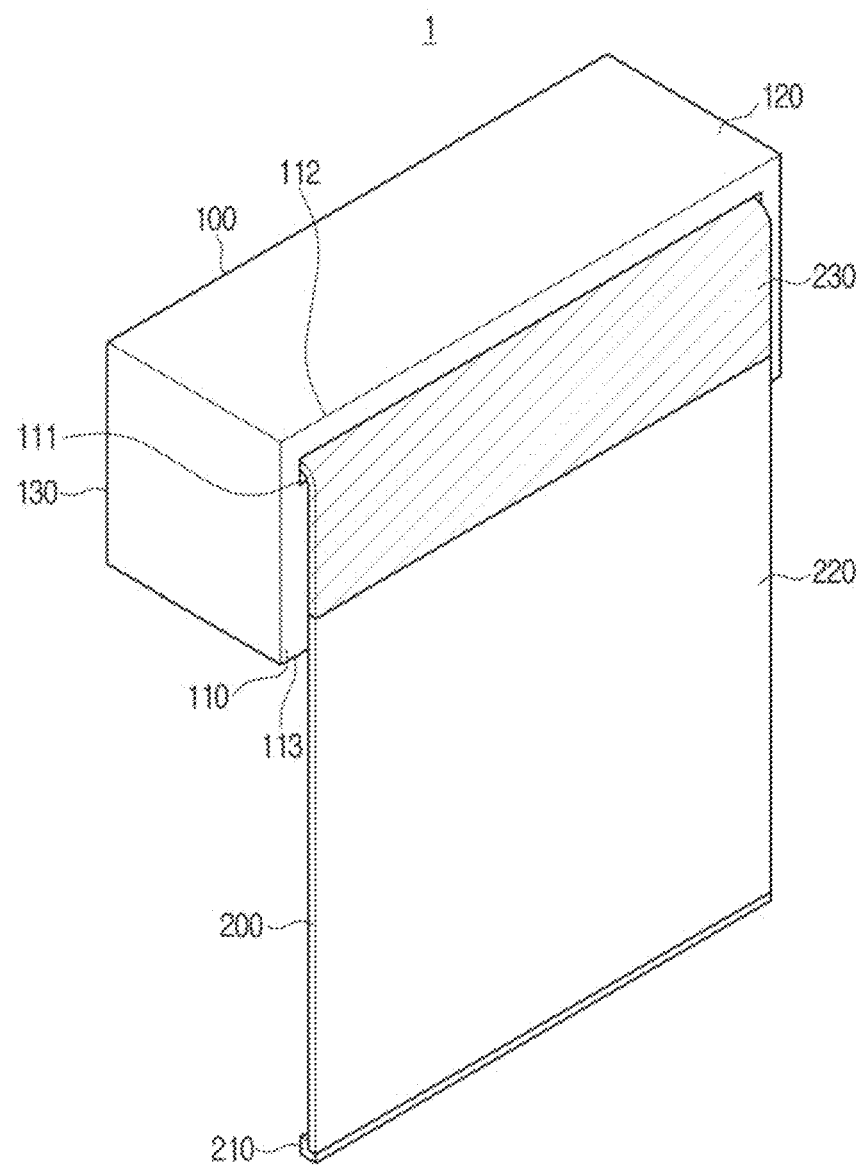
FIG. 6 is a perspective view illustrating a display apparatus in which a display is extracted corresponding to an eye level of a user according to an embodiment.

Referring to FIG. 6, the display apparatus 1 according to an embodiment of the disclosure may be configured to cause the top surface 120 or the rear surface 130 of the housing 100 to be fixed to a ceiling or a wall surface, and to include a structure in which the display 200 is extended from the bottom side of the housing 100.

The opening 111 may be disposed to be adjacent with the first edge 112 corresponding to the top side edge of the front surface 110 of the housing 100. In addition, the display 200 may be extended through the opening 111, and moved toward the second edge 113 corresponding to the bottom side edge.

Accordingly, the user may not only arrange the display apparatus 1 as a stand-type, but also arrange for display apparatus to be fixed on the ceiling or fixed on the wall surface. That is, the user may, without spatial limitations, actively select a fixing method and an arrangement position of the display apparatus 1, an extension direction of the display 200, and the like corresponding to the environment in which the display apparatus 1 may be installed.

The processor 500 may be configured to control the driving device 400 to cause the display 200 to be extended corresponding to the user information detected by the sensor 600. However, the control method of the driving device 400 is not limited thereto, and the user may directly control the driving device 400 to identify an extension amount of the display 200 through a control device (e.g., remote controller, smartphone, wireless earphone, etc.).

The sensor 600 may detect an eye level of the user, and the processor 500 may be configured to control the driving device 400 to cause the display 200 to be extended corresponding to the eye level of the user detected by the sensor 600. That is, the display 200 may extended to cause a center of an area where the image is output to be positioned at an eye level that is the same as the eye level of the user. Accordingly, the user may comfortably view the image that is at an appropriate height to his or her eye level.

In addition, the display 200 may be configured so that a portion of the extended section does not output an image. Specifically, the extended section of the display 200 may be divided into a non-display section 230 which does not output an image from the opening 111 to a point and a display section 220 which outputs an image as shown in FIG. 6. The non-display section 230 may be formed with plastic or fabric, but is not limited thereto.

Based on the non-display section 230 being formed from the extended section of the display, the display section 220 which is connected with the non-display section 230 may be positioned to correspond with the eye level of the user. Furthermore, based on the user selecting a predetermined viewing mode (e.g., normal mode, a child viewing mode with low eye level, etc.), the display section 220 may be positioned at various heights.

Even if the user selects various mounting-types such as fixing the display apparatus 1 on the ceiling or the wall, the non-display section 230 may be formed to a length corresponding thereto, and the user may comfortably view the image output by the display section 220 which is positioned at a height appropriate to the eye level of the user. In addition, based on the display 200 including the non-display section 230, an unnecessary power consumption may be reduced based on the image being output from the full display 200.

Figure 8:
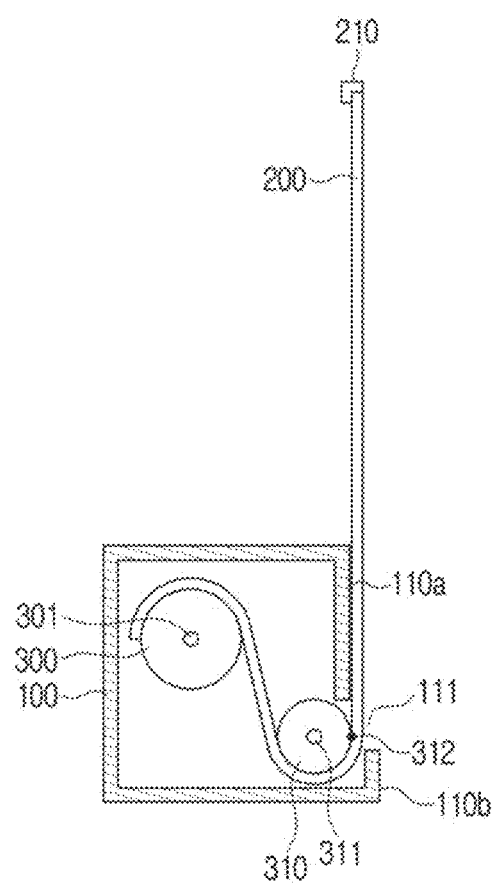
FIG. 8 is a cross-sectional view illustrating a display apparatus comprising an auxiliary roll, and in which a portion of a front-surface of a housing is protruded toward a front according to an embodiment.

FIG. 7 is a cross-sectional view illustrating a display apparatus 1 including an auxiliary roll 310. FIG. 8 is a cross-sectional view illustrating a display apparatus 1 including an auxiliary roll 310, and in which a portion of a front surface 110 of a housing 100 is protruded toward a front.

Referring to FIG. 7, the display apparatus 1 according to an embodiment of the disclosure may include an auxiliary roll 310 which is configured such that at least a portion protrudes through the opening 111. The shaft 311 of the auxiliary roll 310 may be supported to be rotatable in the housing 100, and may rotate in a forward direction or a reverse direction.

The auxiliary roll 310 may be configured for a portion of the display 200 to be rolled thereon and guide a moving direction of the display 200. Specifically, the display 200 may be separated from the auxiliary roll 310 from a maximum protrusion point 312 of the auxiliary roll 310 in a tangential direction and may move in parallel with the front surface 110.

Accordingly, the display 200 may not be abruptly bent after being extracted through the opening 111, and stably change direction along a curvature radius of the auxiliary roll 310 and move parallel with the front surface 110 of the housing.

The minimum curvature of the display 200 may be smaller than or equal to the curvature of the auxiliary roll 310. Accordingly, the display 200 may be configured for a portion thereof to stably move while rolled flexibly on the auxiliary roll 310.

The housing 100 may include a groove 140 to which the shaft 311 of the auxiliary roll 310 may be inserted at the inner surface of the housing, and the auxiliary roll 310 may be configured to cause the shaft 311 to move along the groove 140. Accordingly, the auxiliary roll 310 may be configured so that, at least a portion does not always protrude from the front surface 110 of the housing 100, but may be accommodated within the housing 100 if necessary.

The display apparatus 1 according to an embodiment of the disclosure may include an auxiliary driving device 700 configured to move the auxiliary roll 310. The auxiliary driving device 700 may be a DC motor, a brushless motor, a step motor, a servo motor, or a linear motor, but is not limited thereto, and any power transferable device capable of moving the shaft 311 of the auxiliary roll 310 may be sufficient.

In addition, the processor 500 may be configured to control the auxiliary driving device 700 to cause at least a portion of the auxiliary roll 310 to protrude from the front surface 110 of the housing 100 or the auxiliary roll 310 to be accommodated within the housing 100.

For example, based on the display 200 being extended, the processor 500 may be configured to control the auxiliary driving device 700 to cause at least a portion of the auxiliary roll 310 to protrude from the front surface 110 of the housing 100. Accordingly, the display 200 may be stably extended by the auxiliary roll 310 with at least a portion protruded.

In addition, based on the retraction of the display 200 being completed, the processor 500 may be configured to control the auxiliary driving device 700 to cause the auxiliary roll 310 to be accommodated within the housing 100. Accordingly, because the auxiliary roll 310 is accommodated within the housing and not protruded outside when the display apparatus 1 is not used, the display apparatus 1 may have a compact exterior.

Referring to FIG. 8, the front surface 110 of the housing 100 may be divided into a first front surface area 110a and a second front surface area 110b which is more protruded toward the front F (see, e.g., FIG. 5) than the first front surface area 110a. In addition, the opening 111 may be formed between the first front surface area 110a and the second front surface area 110b, and the auxiliary roll 310 may be configured such that at least a portion thereof protrudes from the first front surface area 110a and may guide the moving direction of the display 200.

Based on the second front surface area 110b of the front surface 110 of the housing 100 being protruded, and the auxiliary roll 310 being protrudingly disposed from the first front surface area 110a, the auxiliary roll 310 may stably guide the moving direction of the display 200 even when accommodated within the housing 100.

That is, as in FIG. 7, the display 200 may be configured to be separated from the auxiliary roll 310 from the maximum protrusion point 312 of the auxiliary roll 310 in a tangential direction and may move in parallel with the front surface 110. In addition thereto, because a portion of the front surface 110 of the housing 100 is protrudingly formed, the display 200 may not be abruptly bent after being extracted through the opening 111, and may move in parallel with the front surface 110 of the housing 100 by stably changing direction along the curvature radius of the auxiliary roll 310 even when the auxiliary roll 310 is accommodated within the housing 100.

Figure 9:
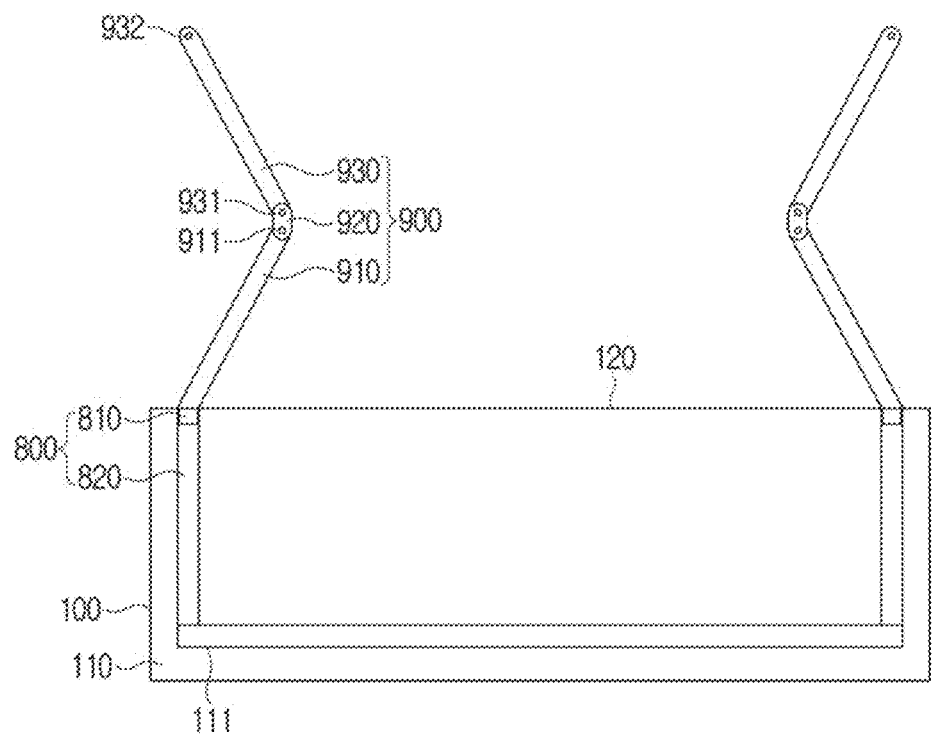
FIG. 9 is a front view illustrating a display apparatus comprising a moving device and a link member according to an embodiment.

FIG. 9 is a front view illustrating a display apparatus comprising a moving device 800 and a link member 900. With respect to FIG. 9, the illustration of the extended display 200 has been omitted for convenience of description.

The moving device 800 may be disposed at the front surface 110 of the housing 100 and may move the display 200 extended through the opening 111 of the front surface 110 to the top surface 120.

The moving device 800 may include a connecting member 810 which is selectively connected with the display 200, a moving guide 820 which provides a path for connecting member 810 to move, and a motor which moves the connecting member 810 along the moving guide 820.

The connecting member 810 may move along the moving guide 820 in a connected state with the top frame 210 of the display 200. The connecting member 810 may push the bottom surface of the top frame 210 and move the display, but the connecting method is not limited thereto, and may be formed of a material with magnetic properties and may be connected with the display 200 by a magnetic force.

The moving guide 820 may be formed as a rail with a groove inserted by a predetermined depth in the front surface 110 of the housing. Accordingly, the moving guide 820 may be configured to form a moving path of the connecting member 810 to cause the connecting member 810 to move only in the designated section on the rail.

The moving guide 820 may be formed to be parallel with the front surface 110 of the housing 100 with the upper end of the opening 111 facing the top surface 120 of the housing 100. The connecting member 810 may move in parallel with the front surface 110 of the housing 100 along the moving guide 820 with the above-described shape.

Based on the display 200 being extended, the connecting member 810 may move from one end to the other end of the moving guide 820 in a connected state with the display 200, and then the link member 900 may continue to move the display 200 in the same direction.

The link member 900 may include a first arm 910, a hinge 920, and a second arm 930, and may be modified to a state supporting the top frame 210 of the display 200 and move the display 200.

The link member 900 may be ordinarily accommodated within the housing 100, and when the display 200 reaches the top surface 120 of the housing 100 by the moving device 800, the link member 900 may be extracted through a slot provided in the top surface 120 of the housing 100 and may move the display 200.

The first arm 910 of the link member 900 may be configured to cause one end to be rotatably connected to the housing 100, and another end 911 to be rotatably connected through one end 931 of the second arm 930 and the hinge 920. The second arm 930 of the link member 900 may be configured to cause another end 932 to be rotatably connected with the top frame 210 of the display 200.

The first arm 910 may be configured to rotate toward a first direction (counter-clockwise direction in FIG. 9) with respect to an axis centered on the one end connected with the housing 100, and the second arm 930 may be configured to rotate in a second direction (clockwise direction in FIG. 9) with respect to an axis centered on the one end 931 connected with the first arm 910.

Accordingly, the link member 900 may stably support the top frame 210 of the display 200, and based on the display being maximally extended, the link member 900 may be configured to maintain a distance between the housing 100 and the top frame 210 to be constant.

In addition, as illustrated in FIG. 9, the link member 900 may be formed to comprise symmetrical left and right portions at the rear surface of the display 200 to more stably support both edges of the top frame 210.

As described above, the display 200 may be moved by the moving device 800 from the opening 111 to the top surface 120 of the housing 100, and may be moved by the link member 900 in the same direction from the top surface 120 of the housing 100.

However, the display 200 is not necessarily moved through the above-described two stages, and the display 200 connected with the connecting member 810 may continue to move without the link member 900 as the moving guide 820 is extendingly formed to the top side of the housing 100 and the connecting member 810 is configured to move along the moving guide 820.

Figure 10:
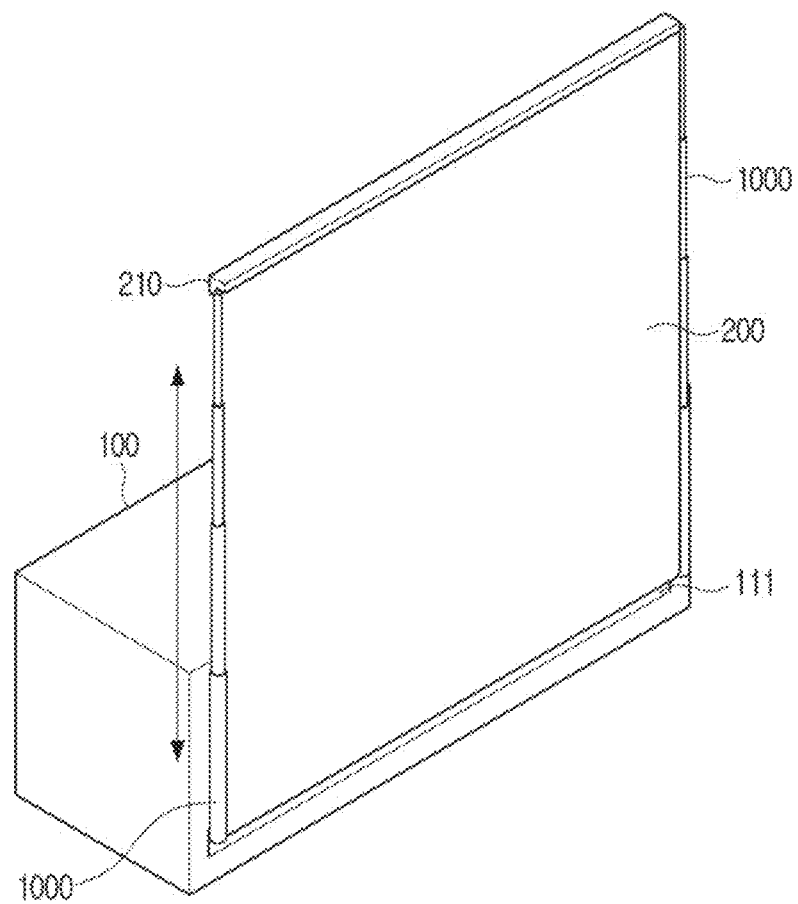
FIG. 10 is a perspective view illustrating a display apparatus comprising a supporting member according to an embodiment.

FIG. 10 is a perspective view illustrating a display apparatus 1 including a supporting member 1000. Referring to FIG. 10, the display apparatus 1 according to an embodiment of the disclosure may be formed as a multilevel structure, and may further include a supporting member 1000 capable of extending and retracting in parallel with the moving direction of the display 200.

The supporting member 1000 may support one area of the extended display 200. For example, the supporting member 1000 in FIG. 10 may be disposed respectively at both ends of the opening 111, and may support both side surfaces of the display 200, but is not limited thereto, and may support a side surface, a rear surface, or a top frame 210 of the display 200.

The supporting member 1000 may extend and retract along the moving direction of the display 200 by a driving source. For example, based on the display 200 being extended, the supporting member 1000 may be extended, and based on the display 200 being retracted, the supporting member 100 may be retracted, and the display 200 may be configured to stably move in a parallel state with the front surface 110 in front of the housing 100.

In addition, because the display 200 supported by the supporting member 1000 is configured so that tension of a predetermined level or more is maintained, the phenomenon of the display 200 changing shape by being bent or inclined to the front or rear may be prevented.

Accordingly, the display apparatus 1 according to an embodiment of the disclosure may, even if the above-described link member 900 (FIG. 9) is not provided, stably retract and extend the display 200 through the opening 111 provided at the front surface 110 of the housing 100 based on the supporting member 1000 capable of extending and retracting supporting the display 200.

While the present disclosure has been illustrated and described with reference to various example embodiments thereof, the present disclosure is not limited to the specific embodiments described. It will be understood by those skilled in the art that various changes in form and details may be made therein without departing from the spirit and scope of the disclosure.

What is claimed is:

1. A display apparatus, comprising:
a housing provided with an opening at a front surface;
a roll disposed within the housing;
a display wound to the roll and capable of extending and retracting through the opening; and
an auxiliary roll configured to guide a movement direction of the display, wherein at least a portion of the auxiliary roll protrudes from the front surface of the housing through the opening,
wherein the opening is disposed to be adjacent to a first edge of the front surface,
wherein the display is configured to move in parallel with the front surface toward a second edge of the front surface facing the first edge from a front of the housing,
wherein the opening of the housing through which the auxiliary roll protrudes is at the front surface of the housing parallel to a surface of the display when the display is in an extended position, and
wherein the display extends along the front surface of the housing outside of the housing when the display is in the extended position.

2. The display apparatus of claim 1, wherein a maximum extension length of the display is twice a horizontal length of the display, the horizontal length of the display extending in a direction perpendicular to a direction of extension of the display.

3. The display apparatus of claim 1, further comprising:
a driving device comprising a motor configured to rotate the roll; and
a processor configured to control the driving device to extend the display corresponding to an output aspect ratio of an image displayed on the display.

4. The display apparatus of claim 1, further comprising:
a driving device comprising a motor configured to rotate the roll;
a sensor configured to detect an eye level of a user; and
a processor configured to control the driving device to extend the display to a position corresponding to the eye level of the user detected by the sensor.

5. The display apparatus of claim 1, wherein a portion of the display from among an extended section of the display does not output an image.

6. The display apparatus of claim 1, wherein the display is configured to be extended from a top side, a bottom side, a left side, or a right side of the housing.

7. The display apparatus of claim 1, wherein the display comprises a flexible material from one end of the display connected to the roll to a point of the display adjacent to the opening.

8. The display apparatus of claim 1, further comprising:
an auxiliary driving device comprising an auxiliary motor configured to move the auxiliary roll; and
a processor configured to cause the at least a portion of the auxiliary roll to protrude from the front surface of the housing, and control the auxiliary driving device to cause the auxiliary roll to be accommodated within the housing.

9. The display apparatus of claim 1, wherein the housing comprises a groove in which a shaft of the auxiliary roll is inserted and supported in an inner surface of the housing, and
wherein the shaft of the auxiliary roll is movable along the groove.

10. The display apparatus of claim 1, wherein the front surface of the housing comprises a first front surface area and a second front surface area that protrudes more toward a front of the housing than the first front surface area,
wherein the opening is formed between the first front surface area and the second front surface area, and
wherein at least the portion of the auxiliary roll protrudes from the first front surface area of the housing.

11. The display apparatus of claim 1, further comprising:
a connecting member configured to selectively connect with the display, the connecting member being movable on the front surface of the housing; and
a motor configured to move the connecting member in parallel with the front surface of the housing.

12. The display apparatus of claim 1, further comprising:
a supporting member comprising a multilevel structure, the supporting member being capable of expanding and contracting in parallel with a moving direction of the display,
wherein the display is supported by the supporting member.

13. A display apparatus, comprising:
a housing provided with an opening at a front surface;
a roll disposed within the housing;
a display wound to the roll and capable of extending and retracting through the opening; and
an auxiliary roll configured to guide a movement direction of the display, wherein at least a portion of the auxiliary roll protrudes from the front surface of the housing through the opening,
wherein the opening is disposed to be adjacent to a first edge of the front surface,
wherein the display is configured to move in parallel with the front surface toward a second edge of the front surface facing the first edge from a front of the housing,
wherein a portion of the display from among an extended section of the display does not output an image,
wherein the portion of the display that does not output the image comprises a plastic or a fabric,
wherein another portion of the display that outputs the image comprises a material different from the plastic or fabric of the portion of the display that does not output the image, and
wherein the display extends along the front surface of the housing outside of the housing when the display is in the extended position.

* * * * *